(12) United States Patent
Serizawa et al.

(10) Patent No.: US 6,575,411 B1
(45) Date of Patent: Jun. 10, 2003

(54) FLAT CONDUCTOR FOLDING AND FIXING DEVICE

(75) Inventors: Yasuyoshi Serizawa, Shizuoka (JP); Minoru Kubota, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/688,218

(22) Filed: Oct. 16, 2000

(30) Foreign Application Priority Data

Oct. 15, 1999 (JP) .......................................... 11-293694

(51) Int. Cl.⁷ .................................................. F16L 3/00
(52) U.S. Cl. .......................... 248/49; 248/544; 24/464; 24/487; 24/545; 174/117 F; 174/135
(58) Field of Search ........................... 248/71, 74.1, 49, 248/544; 174/117 F, 117 FF, 135; 24/464, 487, 545

(56) References Cited

U.S. PATENT DOCUMENTS

| | | | | |
|---|---|---|---|---|
| 3,144,695 A | * | 8/1964 | Budwig | |
| 3,809,798 A | * | 5/1974 | Simon | |
| 4,065,199 A | * | 12/1977 | Andre et al. | |
| 4,192,965 A | * | 3/1980 | Baum | |
| 4,356,599 A | * | 11/1982 | Larson et al. | |
| 4,406,916 A | | 9/1983 | Southerland | |
| 4,650,925 A | * | 3/1987 | Coldren | |
| 5,130,499 A | * | 7/1992 | Dijkshoorn | |
| 5,653,003 A | * | 8/1997 | Freeman | |
| 5,820,048 A | * | 10/1998 | Shereyk et al. | |
| 6,153,827 A | * | 11/2000 | Taranto | |
| 6,206,606 B1 | * | 3/2001 | Mita et al. | |

FOREIGN PATENT DOCUMENTS

| | | | |
|---|---|---|---|
| JP | 4-209417 | 7/1992 | ............ H01B/7/08 |
| JP | 7-31043 | 1/1995 | |
| JP | 10-92238 | 4/1998 | ............ H01B/13/00 |

* cited by examiner

*Primary Examiner*—Korie Chan
(74) *Attorney, Agent, or Firm*—Sughrue Mion, PLLC (57) ABSTRACT

A curved portion 1g of a lead line set 1e is received in a recessed portion 13d that is formed in an inner face 13c of a base piece 13 in the open state. An inner face 17a of a first folded piece 17 is folded on the inner face 13c of the base piece 13, and the curved portion 1g of the lead line set 1e is sandwiched between the base piece 13 and the first folded piece 17. Thereafter, an inner face 21a of a second folded piece 21 is folded on an outer face 17e of the first folded piece 17, and the lead line set 1e portion that is slightly nearer the distal end than the lead line set 1e portion that is folded along a folding line X is sandwiched between the first and the second folded pieces 17 and 21.

7 Claims, 5 Drawing Sheets

FLAT CONDUCTOR FOLDING AND FIXING DEVICE

BACKGROUND OF THE INVENTION

The present invention relates to a folding and fixing device for changing the direction in which a belt-like conductor, such as a portion of a flexible printed circuit board, is extended and for folding the conductor and locking it in place.

For example, a flexible printed circuit board (hereinafter referred to as an "FPC"), used for the assembly of an electric circuit for an automobile, is generally designed so that a copper foil circuit pattern is coated with and sandwiched between insulating film. Especially when the FPC is employed to constitute a circuit portion on which electric devices, such as switches, are mounted, a lead line set, which serves as the electric wiring for these electric devices, and the electric circuit tend to be integrally formed with the circuit portion by using the FPC, wherein the copper foil circuit pattern is coated with and sandwiched between insulating films.

In the FPC, wherein the lead line set is integrally formed with the circuit portion, when the lead line set is extended linearly from a location on the perimeter of the circuit portion, multiple margins remain when an insulating film having a predetermined size is cut along the outline of the circuit pattern, wherein copper foil is sandwiched, and both the employment efficiency of the insulating film and the manufacturing yield are reduced. Therefore, in most cases, the lead line set is perpendicularly curved at the location whereat it is protruded from the perimeter of the circuit portion, and is arranged along the perimeter of the circuit portion.

However, when the distal end of the lead line set reaches a distance measured from the circuit portion of the FPC in the direction wherein the lead line set is first protruded from the perimeter before being curved, the extension of the lead line set along the perimeter of the circuit portion results in the elongation of the lead line set. As a result, even when the efficiency in the use of the insulating film and the manufacturing yield are improved, a satisfactory reduction can not be achieved in the manufacturing costs of the FPC.

In such a case, the lead line set is obliquely bent at a location in the vicinity of that it has been perpendicularly curved. Due to this folding, the direction in which the lead line set is extended is changed from one that follows along the perimeter of the circuit. Thus, even without elongating the lead line set, the distal end of the lead line set can reach a position at a greater distance from the circuit.

As is described above, when the lead line set of the FPC is to be folded, a fixing tool called a clamp, which securely grips the FPC in the bent state, is employed to prevent the recovery force of the FPC from returning the folded leading line set to its original flat state.

A conventionally well known fixing tool is the one disclosed in Japanese Patent Publication No. 4-209417A or No. 10-92238A.

The fixing tool disclosed in the former publication is constituted as follows. Through holes are formed in two portions of an FPC, which are laminated by folding the FPC and aligning the two portions with each other. Then a pin-shaped clip, which projects outward from one of two plates constituting the fixing tool, is inserted into the through holes, and the distal end of the clip is fitted into a hole formed in the other plate. The two portions of the FPC that are thus laminated by folding the FPC are thereafter sandwiched between the two plates.

The fixing tool disclosed in the latter publication is constituted as follows. A flat conductor is sandwiched between split jaws of a gripping plate assembly, and the portion of the flat conductor extending outward from the split jaws of the griping plate assembly is inserted into a cylindrical holder which is connected with the gripping plate assembly by a hinge member. Then, the holder is folded through the hinge member to change the extending direction of the flat conductor.

However, since the fixing tool in the former publication is so designed that the two aligned portions of the folded FPC are sandwiched by the two plates, due to the force exerted by the two plates used to fold the FPC is excessive, and the cutting of the copper foil circuit pattern tends to occur.

Further, since the fixing tool is so designed that the clip formed on the plate is inserted into the through holes in the FPC, when tension force is exerted on the FPC, stress accumulated by the clip is collectively applied to the portions of the FPC whereat the through holes are formed. As a result, tearing of the through holes occurs, and not only is the circuit pattern cut, but in addition, the entire insulating film is torn.

Since the fixing tool in the latter publication is so designed that the folded portion of the flat conductor is not sandwiched between the jaws of the split gripping plate, excessive folding of the flat conductor due to the force exerted by the gripping plate does not occur. In this respect, this fixing tool is preferable to the former fixing tool.

However, in order to maintain the flat conductor in the folded state, the latter fixing tool requires not only an operation whereby the flat conductor is held by the jaws of the split gripping plate, but also a tiresome operation for inserting the portion of the flat conductor that projects outward from the gripping plate into the closed cylindrical holder. As a result, an operating efficiency problem exists.

SUMMARY OF THE INVENTION

To resolve the above problems, it is one objective of the present invention to provide a flat conductor folding and fixing device that can prevent the exertion of excessive folding force or of the exertion of a collective tension force on a folded portion of a flat conductor, and that can hold the flat conductor in the folded state without requiring the employment of a tiresome operation.

In order to achieve the above object, according to the present invention, there is provided a device for folding a flexible flat conductor at a folding line, which intersects an extending direction of the flat conductor and defines a first part and a second part at both sides of the folding line as a boundary, to change an extending direction of the second part from that of the first part, and for fixing the flat conductor in the folded state, comprising:

a base piece on which the first part of the flat conductor is mounted;

a first folded piece connected to the base piece so as to be folded thereon to hold the first part of the flat conductor therebetween, the first folded piece having an edge portion which defines the folding line when the first folded piece is folded on the base piece; and a second folded piece connected to the base piece so as to be folded on the first folded piece to hold the second part of the flat conductor, which has been folded along the folding line, therebetween.

According to the configuration, the flat conductor can be protected from being directly sandwiched and folded along the folding line by the application of an excessive folding force, and tension force is prevented from being collectively exerted on the flat conductor where it is folded along the folding line, thereby protecting the flat conductor from being cut. Further, while the tiresome process involved in the insertion of the flat conductor into and through the closed cylinder is not required, only the folding of the flat conductor along the folding line and the overlapping of the first and the second folded pieces need be performed, so that the flat conductor can be easily folded along the folding line and secured in the folded state.

In this case, preferably, the first folded piece includes a first stopper projection which is abutted against one of widthwise side edges of the second part of the flat conductor which is held between the first folded piece and the second folded piece.

According to the configuration, since the second part of the flat conductor can be prevented from moving in one widthwise direction thereof by the first stopper projection, the flat conductor on the pertinent side can be protected from being torn due to friction or to contact with the base piece, the first folded piece, or the second folded piece.

Preferably, the base piece includes a first engagement member, and the second folded piece includes a second engagement member engaged with the first engagement member when the second folded piece is folded on the first folded piece. The second engagement member is arranged so as to be abutted against the other widthwise side edge of the second part of the flat conductor which is held between the first folded piece and the second folded piece.

According to the configuration, since the second part of the flat conductor can be prevented from moving in both widthwise directions by the first stopper projection and the engagement members, the flat conductor on the pertinent side can be further protected from being torn due to friction or to a contact with the base piece, the first folded piece, or the second folded piece.

Preferably, the second folded piece includes a second stopper projection which is abutted against the other widthwise side edge of the second part of the flat conductor which is held between the first folded piece and the second folded piece.

According to the configuration, the above advantageous effect can be further enhanced.

Preferably, the edge portion of the first folded piece is chamfered.

According to the configuration, the end portion at which the flat conductor is folded relieves the degree of bend in the folded portion, so that excessive folding can be prevented, and the pertinent portion can be protected from being torn.

Preferably, the base piece and the second folded piece are connected via a hinge member. The hinge member covers the folded portion of the flat connector when the second folded piece is folded on the first folded piece.

According to the configuration, the portion of the flat conductor can be folded more precisely along the folding line, and this folded portion can be protected from contact with external objects.

In order to attain the same advantageous effects, according to the present invention, there is also provided a device for folding a flexible flat conductor at a folding line, which intersects an extending direction of the flat conductor and defines a first part and a second part at both sides of the folding line as a boundary, to change an extending direction of the second part from that of the first part, and for fixing the flat conductor in the folded state, comprising:

a base piece on which the first part of the flat conductor is mounted, the base piece having an edge portion which defines the folding line;

a first folded piece connected to the base piece so as to be folded thereon to hold the first part of the flat conductor therebetween; and a second folded piece connected to the base piece so as to be folded on the base piece to hold the second part of the flat conductor, which has been folded along the folding line, therebetween.

In this case, preferably, the base piece includes a first stopper projection which is abutted against one of widthwise edges of the second part of the flat conductor which is held between the base piece and the second folded piece.

Preferably, the base piece includes a first engagement member, and the second folded piece includes a second engagement member engaged with the first engagement member when the second folded piece is folded on the base piece. The second engagement member is arranged so as to be abutted against the other widthwise side edge of the second part of the flat conductor which is held between the base piece and the second folded piece.

Preferably, the second folded piece includes a second stopper projection which is abutted against the other widthwise edge of the second part of the flat conductor which is held between the base piece and the second folded piece.

Preferably, the edge portion of the base piece is chamfered.

Preferably, the base piece and the second folded piece are connected via a hinge member. The hinge member covers the folded portion of the flat connector when the second folded piece is folded on the base piece.

DETAILED DESCRIPTION OF THE PREFERRED EMBODIMENTS

A flat conductor folding and fixing device according to one embodiment of the invention will now be described while referring to the drawings.

Figure 1:
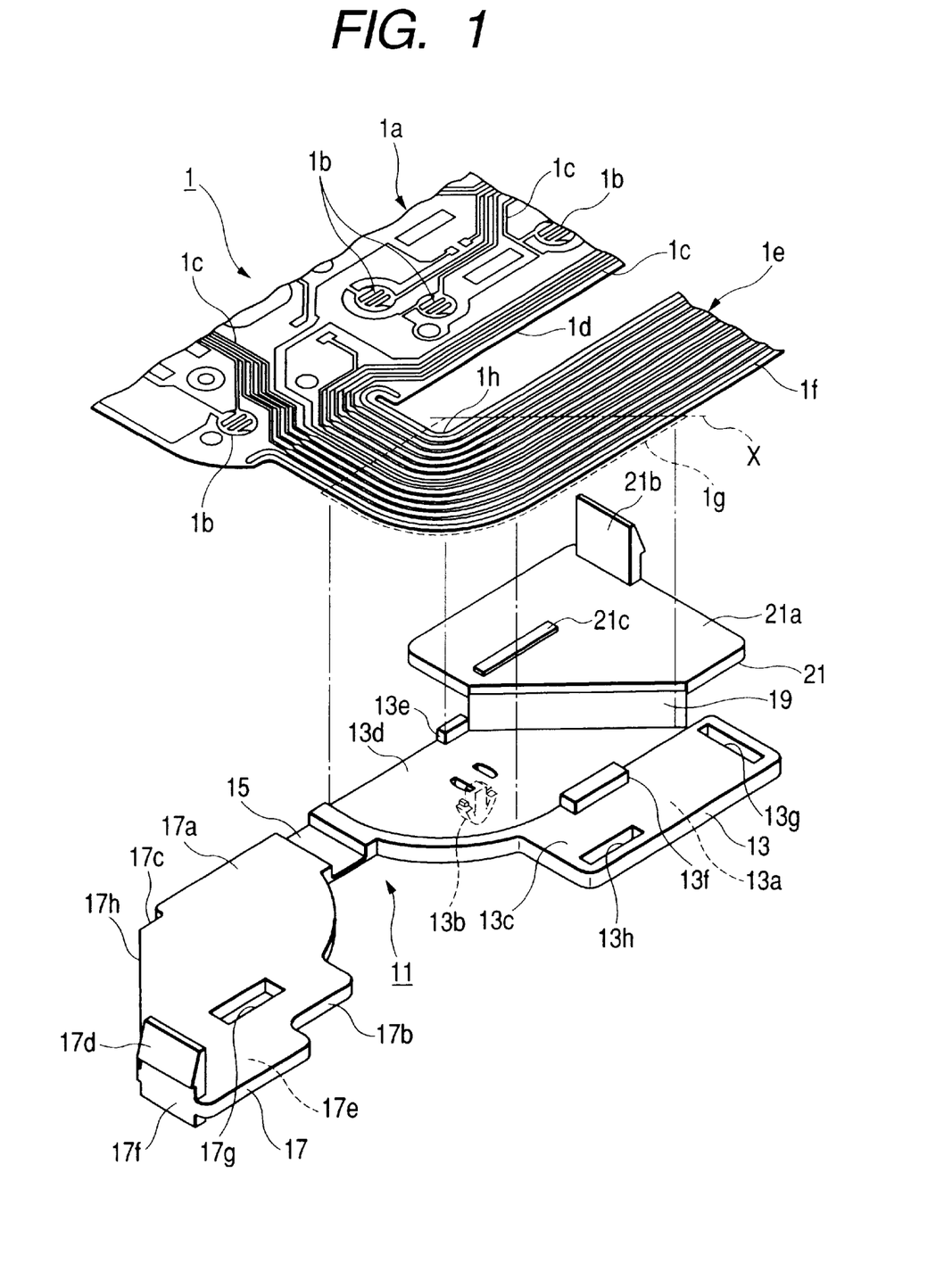
FIG. 1 is a perspective view of a folding and fixing device for a flexible printed circuit board according to one embodiment of the present invention, showing an open state.

FIG. 1 is a perspective view of a flat conductor folding and fixing device (hereinafter referred to as a fixing device) 11 in the developed state according to one embodiment of the invention, together with an FPC 1 that is to be securely maintained in the folded state by using this fixing device.

The FPC comprises: a circuit board 1a, which is stored in switch case 3 (see FIG. 5) for a power window switch (not shown) that is provided for an arm rest (not shown) included in the accessories mounted on the door of an automobile; and a lead line set 1e that is extended outward from the circuit board 1a. Only part of the circuit board 1a and the lead line set 1e are shown in FIG. 1.

A plurality of contact point patterns 1b and conductive patterns 1c, which are connected to the contact point patterns 1b, are formed of copper foil on the circuit board 1a.

Figure 5:
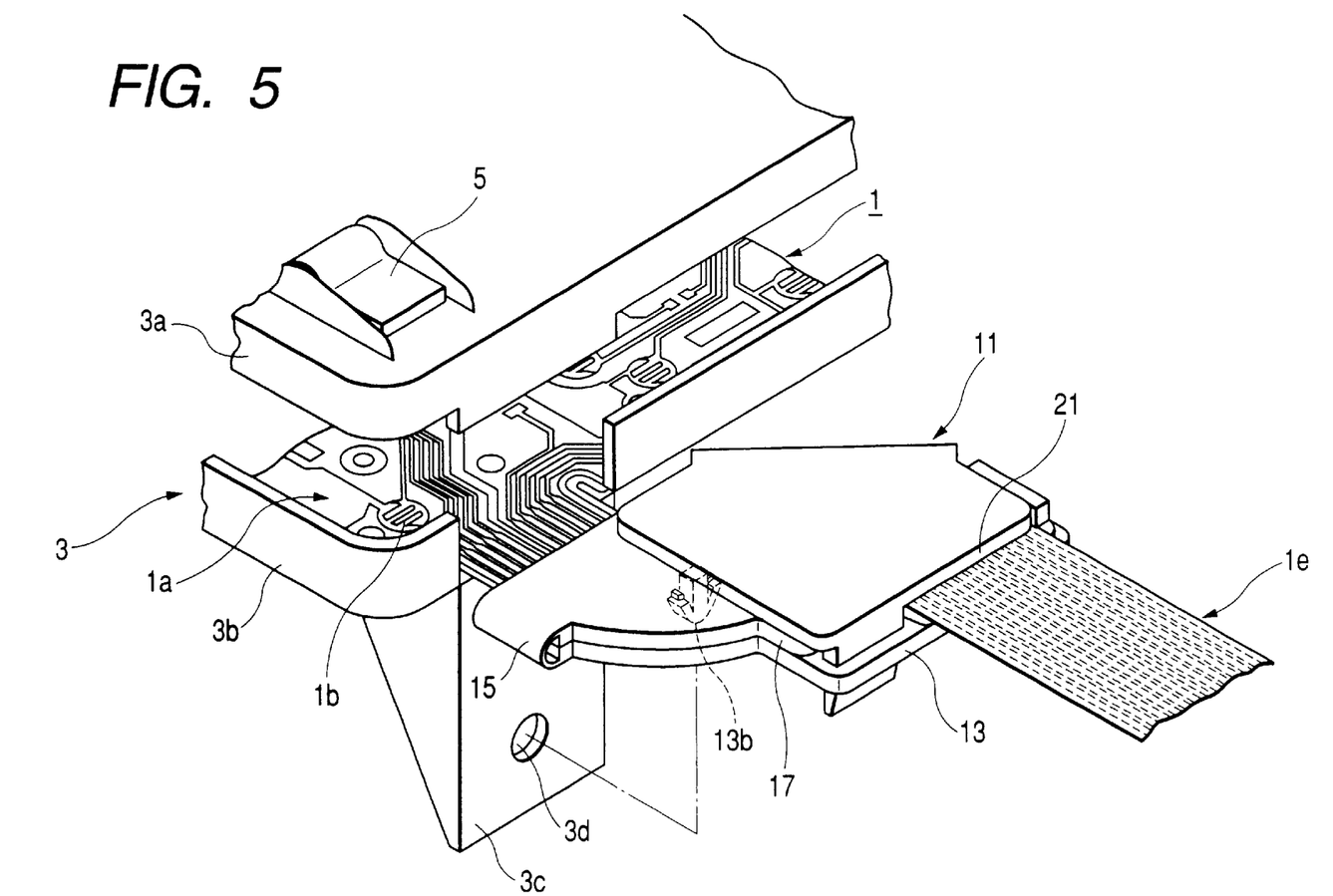
FIG. 5 is a perspective view of the fourth step of the process for fixing the flexible printed circuit board in FIG. 1.

The contact point patterns 1b are so designed that, as is shown in FIG. 5, the circuit board 1a is stored in the switch case 3, constituted by an upper case 3a and a lower case 3b, and a conducive rubber contact (not shown) is selectively brought into contact with the circuit board 1a by turning down a key top 5, located on the upper case 3a. Using the contact provided by the rubber contact, two contact points on each conductive pattern 1c, which are not shown in detail, are rendered conductive.

As is shown in FIG. 1, on the lead line set 1e, a printed pattern if is formed of copper foil and is connected to the conductive patterns 1c. The base of the lead line set 1e is first extended from a location near the corner of the circuit board 1a perpendicular to its perimetral edge 1d, and immediately thereafter, is perpendicularly curved. The distal end of the lead line set 1e is then extended along the perimetral edge 1d of the circuit board 1a.

While the circuit board 1a is stored in the switch case 3, as is shown in FIG. 5, the lead line set 1e is located outside the switch case 3, and is folded, to change the direction of the extension, along a folding line X that is indicated by a chain line in FIG. 1 and that is located nearer the distal end than it is the curved portion.

The fixing device 11 is used to securely maintain the lead line set 11e of the FPC 1 that is folded along the folding line X. The fixing device 11 is so designed that a base piece 13, a first folded piece 17, which is connected to the base piece 13 via a thin wall coupling piece 15, and a second folding piece 21, which is connected to the base 13 via a hinge 19, are integrally formed by using a resin.

A clamp 13b, which is formed on an outer face 13a of the base piece 13, is fitted into a clamp holder 3d in a fixing piece 3c formed as part of the lower case 3b of the switch case 3 in FIG. 5. A recessed portion 13d, which is formed on an inner face of the base piece 13, has a step as thick as the FPC 1, so that the recessed portion 13d is lower by one step than the surrounding inner face 13c.

The recessed portion 13d has a plane shape, corresponding to the curved portion 1g (which matches the flat conductor portion on one side of the folding line X), indicated by a broken line in FIG. 1 that is positioned nearer the base end of the lead line set than the folding line X, and that employs the folding line X as a part of the boundary.

A positioning protrusion 13e is formed on the recessed portion 13d, so that when the curved portion 1g of the lead line set 1e is received in the recessed portion 13d, the side face of the positioning protrusion 13e contacts an inner perimetral edge 1h of the curved portion 1g. And a protrusion 13f and an engagement hole 13g, which are used to position the first folded piece 17, and an engagement hole 13h, which is used to position the second folded piece 21, are formed on and in the internal face 13c extending around the recessed portion 13d.

The positioning protrusion 13g is so provided that, when the curved portion 1g of the lead line set 1e is received in the recessed portion 13d, the side end contacts the side edge opposite the inner perimetral edge 1h in the widthwise direction of the lead line set 1e, which is slightly nearer the distal end than the curved portion 1g.

So that the coupling piece 15, which extends along a portion of the outer face 13a of the base piece 13, will be flexible, it is formed considerably thinner than the base piece 13, while the first folded piece 17 has the same thickness and outer shape as has the base piece 13.

Notches 17b and 17c and a tapered protrusion 17d are formed on an inner face 17a of the first folded piece 17. Thus, when the coupling piece 15 is flexed to bring the inner face 17a into contact with the inner face 13c, which extends around the recessed portion 13d of the base piece 13, and when the first folded piece 17 is aligned with the base piece 13, as in the perspective view in FIG. 2, the first step in the process for securing the FPC 1, the engagement hole 13h of the base piece 13 is exposed through the notch 17b, the positioning protrusion 13e is fitted into the notch 17c, and the tapered protrusion 17d is inserted into and secured in the engagement hole 13g of the base piece 13.

Figure 2:
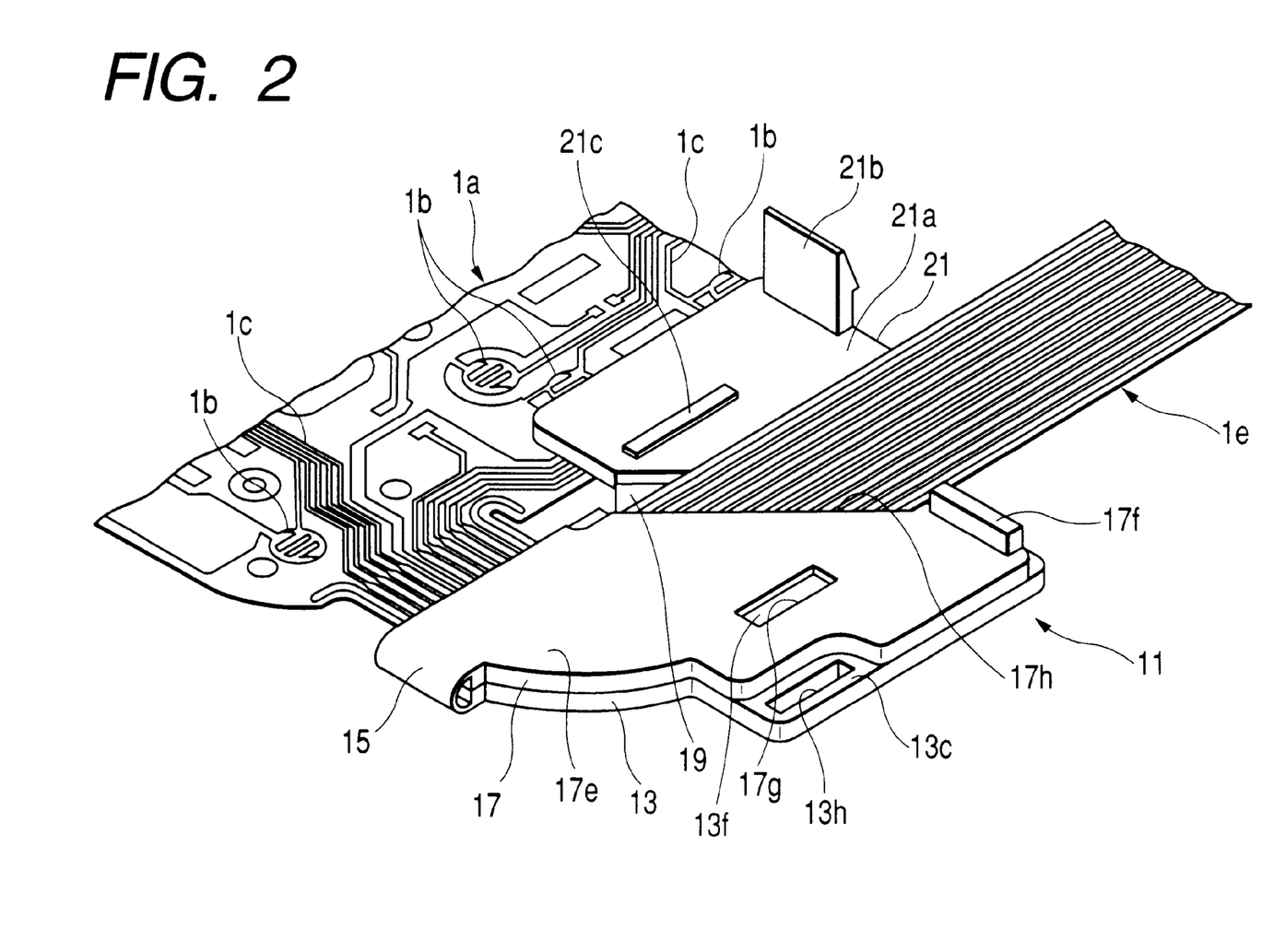
FIG. 2 is a perspective view of the first step of a process for fixing the flexible printed circuit board in FIG. 1.

As is shown in FIG. 1, a positioning protrusion 17f, which is used when the lead line set 1e is being positioned, is formed on the outer face 17e of the first folded piece 17 at a position opposite the protrusion 17d. Also, a positioning hole 17g is formed in the first folded piece 17. And when the first folded piece 17 is folded over the base piece 13, as is shown in FIG. 2, the positioning protrusion 13f on the base piece 13 is inserted into the positioning hole 17g.

The first folded piece has an end face that extends along the folding line X of the lead line set 1e of the FPC 1 in FIG. 1, while the curved portion 1g of the lead line set 1e is received in the recessed portion 13d of the base piece 13. The end face is chamfered, and is used as the guide face 17h that is arced along the thickness of the first folded piece 17.

Figure 3:
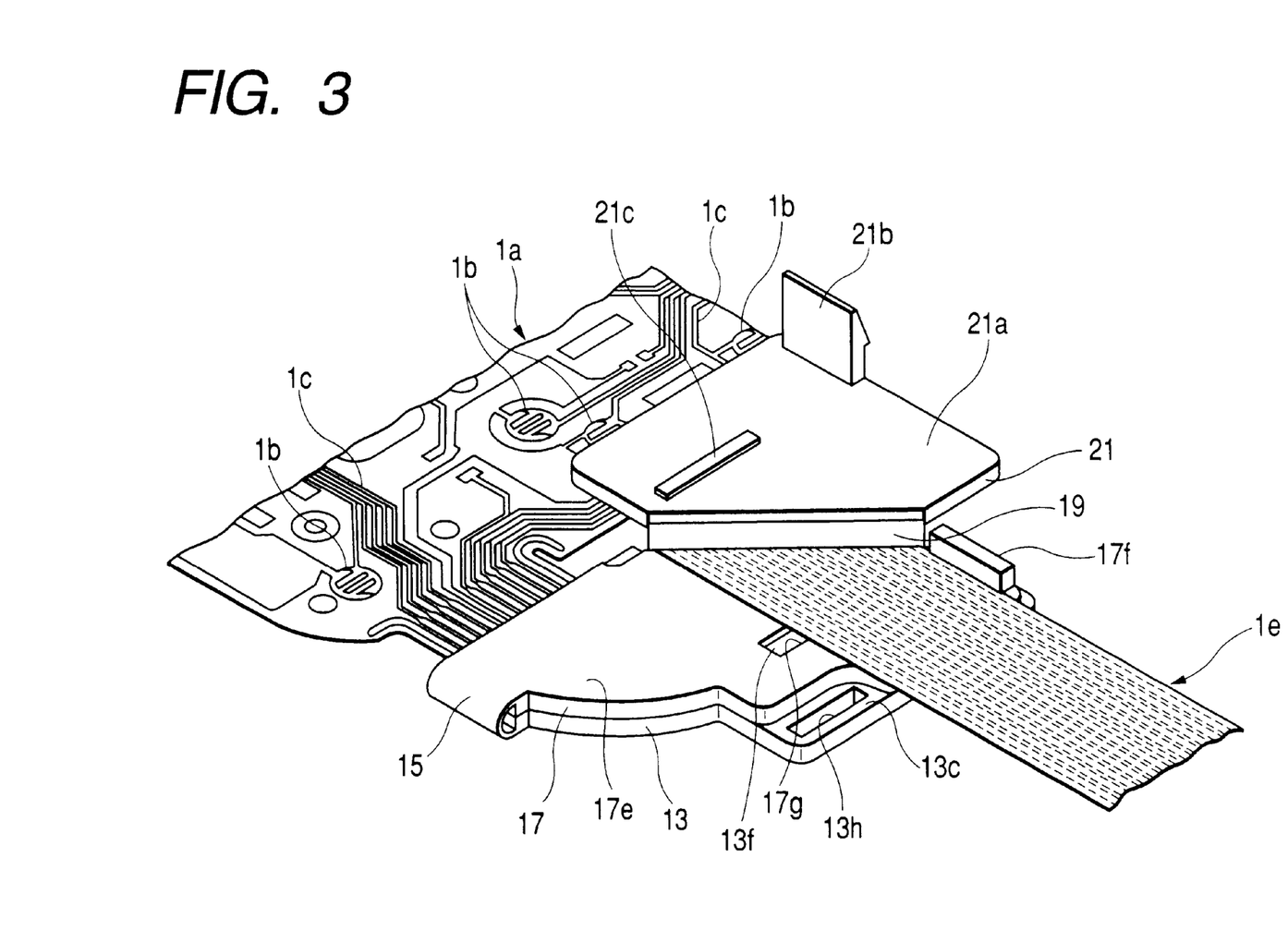
FIG. 3 is a perspective view of the second step of the process for fixing the flexible printed circuit board in FIG. 1.

As is shown in the perspective view in FIG. 3, during the second step in the process performed to secure the FPC 1, when the lead line set 1e is bent along the folding line X in FIG. 1 as the first folded piece 17 is folded over and aligned with the base piece 13, the guide face 17h contacts the inner face of the folded portion of the lead line set 1e and the folded portion is arced in consonance with the guide face 17h. Thereafter, as is also shown in FIG. 3, the inside face of the positioning protrusion 17f is contacted by one of the side edge of the lead line set 1e, which is folded along the folding line X.

So that it will be flexible, the hinge 19, like the coupling piece 15, is formed considerably thinner than the base piece 13. The hinge 19 is formed as an upright component, perpendicular to the inner face 13c of the base piece 13d, at a location on the perimeter of the recessed portion 13d of the base piece 13 corresponding to that of the folding line X in the lead line set 1e in FIG. 1, the curved portion 1g of which is received in the recessed portion 13d.

The height of the hinge 19, measured from the recessed portion 13d, equals the total height of the step between the inner face 13c and the recessed portion 13d of the base piece and the thicknesses of the first and the second folded pieces 17 and 21. As is shown in FIG. 3, when the first folded piece 17 is folded over the base piece 13 and the lead line set 1e is folded along the folding line X in FIG. 1, the inner surface of the folded portion of the lead line set 1e contacts the guide face 17h, while its outer face is covered by the hinge 19.

The second folded piece 21 has substantially the same thickness as the base piece 13 and is slightly smaller than the base piece 13. A tapered protrusion 21b is formed along the edge of an inner face 21a of the second folded piece 21, and a positioning protrusion 21c, whose height is substantially equal to the thickness of the FPC 1, is formed close to the center of an inner face 21a of the second folded piece 21.

Figure 4:
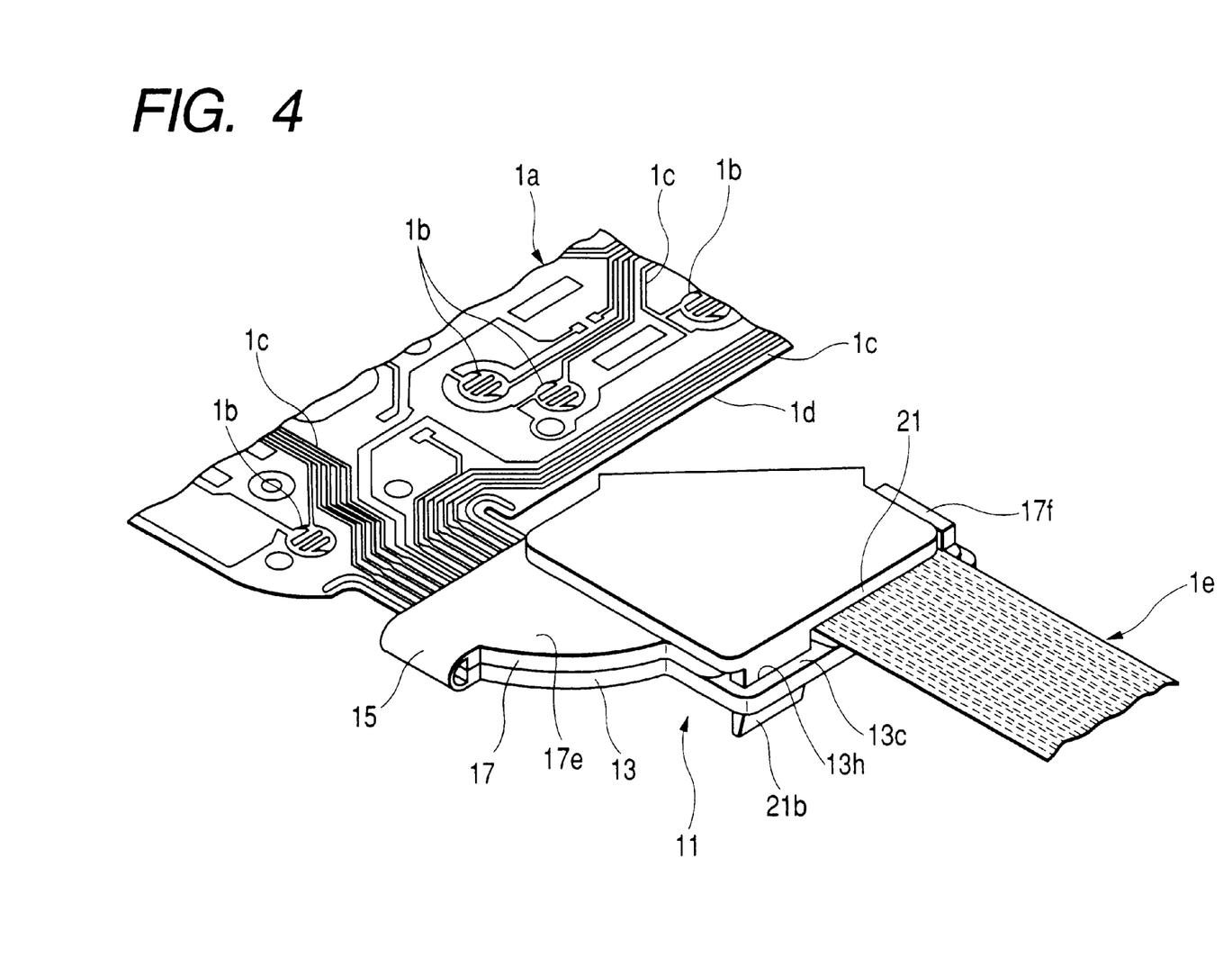
FIG. 4 is a perspective view of the third step of the process for fixing the flexible printed circuit board in FIG. 1.

When the hinge 19 is folded to bring the inner face 21a into contact with the outer face 17e of the first folded piece 17, which is folded over the base piece 13, and when the second folded piece 21 is folded over the first folded piece 17, as is shown in the perspective view in FIG. 4, pursuant to the third step of the process performed to secure the FPC 1, the engagement protrusion 21b is inserted into and locked in the engagement hole 13h, and the positioning protrusion 21 c is brought into contact with the outer face 17c of the first folded piece 17.

Further, when the second folded piece 21 is folded over the first folded piece 17 as is shown in FIG. 4, side faces of the engagement protrusion 21b and the positioning protrusion 21c contact the side edge of the lead line set 1e, which is folded along the folding line X as in FIG. 3, opposite the side contacted by the positioning protrusion 17f.

The operation of the thus arranged fixing device 11 of this embodiment will now be described.

First, the curved portion 1g of the lead line set 1e of the FPC 1 is received in the recessed portion 13d of the base piece 13, and the first folded piece 17 is folded over the base piece 13, as is shown in FIG. 2. Then, the engagement protrusion 17d of the first folded piece 17 is inserted into and locked in the engagement hole 13g of the base piece 13. Thus, the first folded piece 17 is able to counter the recovery force exerted by the coupling piece 15, which can return the first folded piece 17 to its original, open state, and to remain in place, folded over the base piece 13.

Since the recessed portion 13d of the base piece 13 is lower than the surrounding inner face 13c by a step equal in height to the thickness of the FPC 1, when the first folded piece 17 is folded over the base piece 13, the inner face 13c of the base piece 13 and the inner face 17a of the first folded piece 17 are brought into contact with the individual faces of the curved portion 1g of the lead line set 1e.

When the inner face 13c of the base piece 13 and the inner face 17a of the first folded piece 17 contact the individual faces of the curved portion 1g of the lead line set 1e, the curved portion 1g is sandwiched therebetween and is so secured by the fixing device 11 that move of the curved portion 1g in the extending direction thereof can be restricted.

While the curved portion 1g of the lead line set 1e is sandwiched between the base piece 13 and the first folded piece 17, the side faces of the positioning protrusions 13e and 13f of the base piece contact the opposing widthwise side edges of the portion of the lead line set 1e that is slightly closer to the distal end than to the curved portion 1g. Thus, the lead line set 1e is so secured by the fixing device 11 that move of the curved portion 1g in the widthwise direction thereof also can be restricted.

The hinge 19 is then bent so that the second folded piece 21 overlaps the first folded piece 17, the lead line set 1e, whose curved portion 1g is sandwiched between the base piece 13 and the first folded piece 17, is again folded over by the second folded piece 21 along the folding line X in FIG. 1. Then, of the lead line set 1e that extends along the perimetral edge 1d of the circuit board 1a, the portion closer to the distal end, measured from the curved portion 1g, is changed so that it extends perpendicular to the perimetral edge 1d.

Thereafter, the guide face 17h of the first folded piece 17 is brought into contact with the inner face of the portion of the lead line set 1e that is folded to change the extending direction, and the folded portion is arced in consonance with the guide face 17h. Thus, since the folded portion of the lead line set 1e is thereby prevented from being folded over excessively, the printed pattern If is protected from being cut.

In addition, since the hinge 19 is located outside the portion of the lead line set 1e that is folded to change the extending direction, the folded portion of the leading line set 1e can thus be protected from being damaged through contact with an external foreign object.

Following this, when the first and the second folded pieces 17 and 21 have been completely overlapped, as is shown in FIG. 4, the engagement protrusion 21b of the second folded piece 21 is inserted into and locked in the engagement hole 13h of the base piece 13. Thus, the second folded piece 21 is able to counter the recovery force exerted by the hinge 19, which can return the second folded piece 21 to its original, open state, and to remain in place, folded over the first folded piece 17.

As a result of the overlapping of the first and the second folded pieces 17 and 21, the distal end of the positioning protrusion 21c of the second folded piece 21 contacts the outer face 17e of the first folded piece 17.

The height of the hinge 19, measured from the recessed portion 13d, is set equal to the total size of the step between the inner face 13c and the recessed portion 13d of the base piece 13 and the thicknesses of the first and the second folded pieces 17 and 21. Since the positioning protrusion 21c of the second folded piece 21 is formed at a height substantially equal to the thickness of the FPC 1, the outer face 17e of the first folded piece 17 and the inner face 21a of the second folded piece 21 contact the individual faces of the lead line set 1e that is closer to the distal end when measured from the folded portion.

Then, since the part of the lead line set 1e that is slightly closer to the distal end when measured from the folded portion is securely sandwiched between the first and the second folded pieces 17 and 21, move of the pertinent portion of the lead line set 1e in the extending direction thereof can be restricted.

While the lead line set 1e portion that is slightly closer to the distal end from the folded portion is sandwiched by the first and the second folded pieces 17 and 21, the side face of the positioning protrusion 17f of the first folded piece 17 and the side faces of the protrusions 21b and 21c of the second folded piece 21 contact both widthwise side edges of the pertinent portion of the lead line set 1e. Thus, move of the pertinent portion of the lead line set 1e in the widthwise direction thereof can also be restricted.

Finally, as is shown in the perspective view in FIG. 5, as the fourth step of the process performed to secure the FPC 1, the clamp 13, which projects downward from the outer face 13a of the base piece 13, is fitted into the clamp hole 3d in the fixing piece 3c, which is formed as part of the lower case 3b of the switch case 3, and the fixing device 11 is secured to the lower case 3b.

Therefore, the curved portion 1g of the lead line set 1e, which is sandwiched between the base piece 13 and the first folded piece 17, and the portion of lead line set 1e, which is sandwiched between the first and the second folded pieces 17 and 21 and which is slightly closer to the distal end than to the folded portion, are positioned and secured to the circuit board 1a that is stored in the switch case 3, which is constituted by the upper case 3a and the lower case 3b.

As a result, the tension force exerted by the distal end of the lead line set 1e acts directly on the lead line set 1e portion that is sandwiched by the first and the second folded pieces 17 and 21 and that is slightly closer to the distal end than to the folded portion.

And thus, the tension force exerted by the distal end of the lead line set 1e is received by the fixing piece 3c of the lower case 3b of the switch case 3, wherein the clamp hole 3d is formed into which is fitted the clamp 13b on the base piece 13 that is connected to the first and the second folded pieces 17 and 21. The tension force exerted by the lead line set 1e is not imposed on the joint at the circuit board 1a and the lead line set 1e, and on the folded portion.

As is described above, according to the fixing device 11 of this embodiment, in the open state, the curved portion 1g of the lead line set 1e is received in the recessed portion 13d that is formed in the inner face 13c of the base piece 13. The inner face 17a of the first folded piece 17 is aligned with the inner face 13c of the base piece 13, and the curved portion 1g of the lead line set 1e is sandwiched between the base piece 13 and the first folded piece 17. Further, the inner face 21a of the second folded piece 21 is aligned with the outer face 17e of the first folded piece 17, and the lead line set 1e portion that is slightly closer to the distal end than to the folded portion is sandwiched between the first and the second folded pieces 17 and 21.

Since the lead line set 1e is protected from being directly sandwiched and folded along the folding line X by the application of an excessive folding force, and since the tension conveyed from the distal end of the leading line set 1e is prevented from being collectively applied to the folded portion, cutting of the printed circuit pattern 1f of the lead line set 1e does not occur. Further, the tiresome process involved in the insertion of the lead line set 1e into and through the closed cylinder is not required while the folded portion of the lead line set 1e can be easily secured.

One part or all of the positioning protrusions 13e and 13f, which are provided to regulate the movement of the lead line set 1e in the widthwise direction, the positioning protrusion 17f on the first folded piece 17, and the engagement protrusion 21b and the positioning protrusion 21c on the second folded piece 21 may be eliminated. However, it is more effective for one part or all of these components are formed as shown for the fixing device of this embodiment, because the portion of the lead line set 1e that is sandwiched between the base piece 13 and the first folded piece 17, and the portion of the lead line set 1e that is sandwiched between the first and the second folded piece 17 and 21 can be prevented from being moved widthwise between these components, thus protecting the circuit pattern if of the lead line set 1e from being cut due to friction or due to contact with the fixing device 11.

Furthermore, as in the fixing device 11 of this embodiment, in order to maintain the positioning of the second folded piece 21, which is folded over the first folded piece 17, it is effective for the engagement protrusion 21b of the second folded piece 21, which is inserted into and locked in the engagement hole 13h of the base piece 13, to be used as a member for restricting the widthwise movement of the lead line set 1e. The widthwise movement of the lead line set 1e can thus be restricted without the structure becoming overly complicated.

The guide face 17h of the first folded piece 17 may not be chamfered as a normal end face. However, as in the fixing device 11 of this embodiment, it is more effective for the guide face 17h to be arced toward the thickness of the first folded piece 17. Then, the guide face 17h contacts the inner face of the folded portion of the lead line set 1e, and the folded portion is arced in consonance with the shape of the guide face 17h, thereby preventing the lead line set 1e from being folded over excessively and protecting the circuit pattern 1f from being cut.

When the curved portion 1g of the lead line set 1e is received in the recessed portion 13d, the hinge 19, provided between the base piece 13 and the second folded piece 21, may be upright relative to a perimetral edge other than the edge of the recessed portion 13d that is positioned along the folding line X of the lead line set 1e.

However, as in the fixing device 11 of this invention, it is more effective, while the curved portion 1g of the lead line set 1e is received in the recessed portion 13d, for the hinge 19 is formed upright relative to the perimetral edge of the recessed portion 13d that is positioned along the folding line X of the lead line set 1e. Then, when the hinge 19 is folded so that the second folded piece 21 overlaps the first folded piece 17, the lead line set 1e is folded along the folding line X, and the hinge 19 is positioned outside the folded portion of the lead line set 1e to protect the folded portion of the lead line set 1e from contact with an external foreign object.

Further, in this embodiment, the curved portion 1g of the lead line set 1e is sandwiched between the base piece 13 and the first folded piece 17, and the portion of the lead line set 1e that is slightly closer to the distal end than the folded portion at the folding line X is sandwiched between the first and the second folded pieces 17 and 21. One of these sandwiched components may be secured in place, instead of being sandwiched, so that the components can be prevented from being returned to the open state due to the recovery force exerted by the lead line set 1e.

However, as in the fixing device 11 of this embodiment, it is more effective for the curved portion 1g of the lead line set 1e to be sandwiched between the base piece 13 and the first folded piece 17, and for the portion of the lead line set 1e that is slightly closer to the distal end than the folded portion at the folding line X to be sandwiched between the first and the second folded pieces 17 and 21. Then, the portion that is nearer the tension force generation source than the lead line set 1e portion folded along the folding line X can resist both the tension force exerted by the distal end of the lead line set 1e and the tension force exerted by the base end, and tension force can be prevented from being applied to the folded portion of the lead line set 1e.

In the fixing device 11 of this invention, the curved portion 1g of the lead line set 1e is sandwiched between the base piece 12 and the first folded piece 17, which are overlapped, and then, the portion of the lead line set 1e that is slightly nearer the distal end than the portion folded along the folding line X is sandwiched by overlapping the first folded piece 17 with the second folded piece 21.

However, after the curved portion 1g of the lead line set 1e is sandwiched between the base piece 13 and the first folded piece 17, the outer face of the second folded piece 21 may be aligned with the outer face 13a of the base piece 13, and the lead line set 1e portion that is slightly nearer the distal end than the lead line set 1e portion folded along the folding line X may be sandwiched between the base piece 13 and the second folded piece 21. In this case, the clamp 13b is relocated, so that it projects outward from a different position on the outer face 13a of the base piece 13.

Further, in this embodiment, the fixing device of the present invention has been employed for an FPC 1 that is related to a power window switch provided for an arm rest included in the accessories mounted on the door of an automobile. However, the present invention can be applied not only for a fixing device for the FPC 1 for a switch, but also for other, general flat conductor folding fixing devices, such one that is used for an automobile wire harness or one that is used in a field other than automobiles, that are used to fold various types of flexible flat conductors, including a flat wire cable, and to securely maintain the flat conductors in the folded state.

What is claimed is:

1. A device for folding a flexible flat conductor at a folding line, which intersects an extending direction of the flat conductor and defines a first part and a second part at both sides of the folding line as a boundary, to change an extending direction of the second part from that of the first part, and for fixing the flat conductor in the folded state, comprising:

a base piece on which the first part of the flat conductor is mounted;

a first folded piece connected to the base piece so as to be folded thereon to hold the first part of the flat conductor therebetween, the first folded piece having an edge portion which defines the folding line when the first folded piece is folded on the base piece; and a second folded piece connected to the base piece so as to be folded on the first folded piece to hold the second part of the flat conductor, which has been folded along the folded line, therebetween, wherein the first folded piece includes a first stopper projection, which is abutted against one of widthwise side edges of the second part of the flat conductor which is held between the first folded piece and the second folded piece.

2. The folding and fixing device as set forth in claim 1, wherein the base piece includes a first engagement member, and the second folded piece includes a second engagement member engaged with the first engagement member when the second folded piece is folded on the first folded piece; and wherein the second engagement member is arranged so as to be abutted against the other widthwise side edge of the second part of the flat conductor which is held between the first folded piece and the second folded piece.

3. The folding and fixing device as set forth in claim 1, wherein the edge portion of the first folded piece is chamfered.

4. The folding and fixing device as set forth in claim 1, wherein the base piece and the second folded piece are connected via a hinge member; and wherein the hinge member covers the folded portion of the flat connector when the second folded piece is folded on the first folded piece.

5. The folding and fixing device as set forth in claim 1, wherein the second folded piece includes a second stopper projection which is abutted against the other widthwise side edge of the second part of the flat conductor which is held between the first folded piece and the second folded piece.

6. A folding and fixing device, comprising:

a flat conductor with a folding line, which intersects an extending direction of the flat conductor and defines a first part and a second part at both sides of the folding line as a boundary; a base piece on which the first part of the flat conductor is mounted;

a first folded piece connected to the base piece so as to be folded thereon to hold the first part of the flat conductor therebetween, the first folded piece having an edge portion which defines the folding line when the first folded piece is folded on the base piece; and a second folded piece connected to the base piece so as to be folded on the first folded piece to hold the second part of the flat conductor, which has been folded along the folded line, therebetween, and to change an extending direction of the second part from that of the first part;

wherein the first folded piece includes a first stopper projection, which is abutted against one of widthwise side edges of the second part of the flat conductor which is held between the first folded piece and the second folded piece.

7. A folding and fixing device comprising:

a flat conductor with a folding line, which intersects an extending direction of the flat conductor and defines a first part and a second part at both sides of the folding line as a boundarya base piece on which the first part of the flat conductor is mounted;

a first folded piece connected to the base piece so as to be folded thereon to hold the first part of the flat conductor; and a second folded piece connected to the base piece so as to be folded on the first folded piece to hold the second part of the flat conductor, which has been folded along the folded line, therebetween, and to change an extending direction of the second part from that of the first part;

wherein the first folded piece includes a first stopper projection, which is abutted against one of widthwise side edges of the second part of the flat conductor which is held between the first folded piece and the second folded piece.

* * * * *